United States Patent [19]
Chen et al.

[11] Patent Number: 6,017,796
[45] Date of Patent: Jan. 25, 2000

[54] METHOD OF FABRICATING FLASH ELECTRICALLY-ERASABLE AND PROGRAMMABLE READ-ONLY MEMORY (EEPROM) DEVICE

[75] Inventors: Hwi-Huang Chen, Hsinchu; Gary Hong, Hsin-Chu, both of Taiwan

[73] Assignee: United Semiconductor Corp., Hsinchu, Taiwan

[21] Appl. No.: 09/138,757

[22] Filed: Aug. 24, 1998

[30] Foreign Application Priority Data

Jun. 18, 1998 [TW] Taiwan .................................. 87109766

[51] Int. Cl.$^7$ .................................................. H01L 21/336
[52] U.S. Cl. ............................ 438/264; 438/257; 438/571; 438/583; 438/655
[58] Field of Search ........................................ 438/257, 261, 438/264, 266, 571, 572, 573, 574, 582, 583, 585, 592, 594, 655, 656, 652

[56] References Cited

U.S. PATENT DOCUMENTS

| | | | |
|---|---|---|---|
| 4,419,810 | 12/1983 | Riseman | 438/303 |
| 5,094,979 | 3/1992 | Kusano | 438/652 |
| 5,180,689 | 1/1993 | Liu et al. | 438/640 |
| 5,183,772 | 2/1993 | Jin et al. | 438/253 |
| 5,203,957 | 4/1993 | Yoo et al. | 438/640 |
| 5,216,267 | 6/1993 | Jin et al. | 257/306 |
| 5,552,331 | 9/1996 | Hsu et al. | 438/258 |
| 5,792,695 | 8/1998 | Ono et al. | 438/257 |

*Primary Examiner*—Carl Whitehead, Jr.
*Assistant Examiner*—Khanh Duong
*Attorney, Agent, or Firm*—Christie, Parker & Hale, LLP

[57] ABSTRACT

A semiconductor fabrication method for fabricating a flash EEPROM (electrically erasable and programmable read-only memory) device uses STI (shallow-trench isolation) technique to form the field oxide isolation layers so as to make the EEPROM device suitable for fabrication at the submicron level of integration. By this method, the first step is to prepare a semiconductor substrate. Next, a plurality of field oxide isolation layers are formed through the STI technique to define active region in the substrate. After this, at least one gate structure is formed within the active region, which includes a tunnel oxide layer, a first conductive layer serving as a floating gate, a dielectric layer, a second conductive layer serving as a control gate, and a topping layer. Subsequently, an ion-implantation process is performed to form source/drain regions beside the gate structure. A sidewall spacer is then formed on the sidewall of the gate structure. Next, a metallization layer is formed over the entire substrate and then an insulating layer is formed over the metallization layer. The insulating layer is then selectively removed in such a manner that the remaining part thereof covers the source region and the field oxide isolation layers neighboring the source region. Finally, all the part of the metallization layer that is uncovered by the remaining part of the insulating layer is entirely removed.

22 Claims, 10 Drawing Sheets

METHOD OF FABRICATING FLASH ELECTRICALLY-ERASABLE AND PROGRAMMABLE READ-ONLY MEMORY (EEPROM) DEVICE

CROSS-REFERENCE TO RELATED APPLICATION

This application claims the priority benefit of Taiwan application serial no. 87109766, filed Jun. 18, 1998, the full disclosure of which is incorporated herein by reference.

BACKGROUND OF THE INVENTION

1. Field of the Invention

This invention relates to semiconductor fabrication technology, and more particularly, to a method of fabricating a flash EEPROM (electrically erasable and programmable read-only memory) device.

2. Description of Related Art

An EEPROM (also abbreviated as $E^2PROM$) is a semiconductor, nonvolatile, programmable read-only memory whose contents can be electrically erased and then selectively rewritten without having to remove it from its host circuit board. Because it is easily erased and programmed, the EEPROM can be more versatilely used in computers and various other intelligent electronic devices besides other types of ROMs. Conventional EEPORM devices are typically constructed based on a floating-gate structure. With EEPROM, the data erasure and reprogramming operation can be carried out in a bit-by-bit manner, typically at an access speed (access time) within the range of 150–200 ns (nanoseconds). Newer EEPROMs developed by the Intel Corporation of America, called flash EEPROMs, have an even higher access speed within the range of 70–80 ns.

A conventional flash EEPROM device is illustratively depicted in the following with reference to FIG. 1 FIGS. 1A–1C, and FIG. 2. FIG. 1 shows a schematic top view of the conventional flash EEPROM device and FIGS. 1A, 1B, and 1C are three different cross-sectional views of the flash EEPROM device of FIG. 1 respectively cutting through the lines I—I, II—II, and III—III.

Referring to FIG. 1 together with FIGS. 1A, 1B, and 1C, this conventional flash EEPROM device is constructed on a semiconductor substrate 100. In this flash EEPROM device, each memory cell is based on a MOS transistor element (called a floating-gate transistor) that is composed of a tunnel oxide layer 104, a floating gate 106, a dielectric layer 108, a control gate 110, a source region 112, and a drain region 114. The floating gate 106 is so named due to the fact that it is physically but not electrically isolated from all the other conductive elements in the flash EEPROM device. The floating gate 106 is located beneath the control gate 110 and isolated by the dielectric layer 108 from the control gate 110. The control gate 110 is electrically connected to one word line (not shown) of the flash EEPROM device.

The floating-gate transistor of each MOS memory cell of the flash EEPROM device can be operated in various ways. The following describes one of them. To write data into memory cell, the first step is to apply a drain voltage to the drain region 114 while applying a gate voltage, which is higher than the drain voltage, to the control gate 110. This action causes hot electrons to be emitted from the source region 112 and then pass through the channel to the drain region 114. Since these hot electrons are very high in energy, they can penetrate through the tunnel oxide layer 104 into the floating gate 106 to be trapped in the floating gate 106, thus causing an increase in the threshold voltage of the floating gate 106. This effectively sets the MOS memory cell to a state that represents the storage of a value of binary data into the MOS memory cell. On the other hand, when the data currently stored in the MOS memory cell needs to be erased, a reverse voltage is applied to the source region 112 to cause the electrons trapped in the floating gate 106 to be pulled out of the floating gate 106 through the tunnel oxide layer 104, thus causing the threshold voltage of the floating gate 106 to be lowered to the original level, effectively setting the MOS memory cell back to the original state.

To fabricate the foregoing flash EEPROM device, the first step is to perform a LOCOS (local oxidation of silicon) process on the substrate 100 so as to form a plurality of field oxide isolation layers 102 at selected locations to define the active regions where the MOS memory cells of the flash EEPROM device are to be formed. In subsequent steps, an oxide layer is formed and selectively removed to form the tunnel oxide layer 104; a first polysilicon layer is formed and selectively removed to form the floating gate 106; a dielectric layer is formed and selectively removed to form the dielectric layer 108; and a second polysilicon layer is formed and selectively removed to form the control gate 110. After this, with the polysilicon-based control gate 110 serving as a mask, an ion implantation process is performed on the wafer to dope an impurity element into the unmasked portions of the substrate 100, whereby the source region 112 and the drain region 114 are formed in the substrate 100. Subsequently, an insulating layer is formed and then etched back to form the sidewall spacers 116 on the sidewalls of the stacked structure of the tunnel oxide layer 104, the floating gate 106, the dielectric layer 108, and the control gate 110. After this, each field oxide isolation layer 102 between neighboring pair of source regions 112 is removed, leaving a void portion 150 in the wafer. Next, an ion-implantation process is performed to dope an impurity element through the void portion 150 into the exposed part of the substrate 100, whereby a self-aligned source region 118 is formed in the substrate 100. As shown in FIG. 1C, each self-aligned source region 118 is connected to each of the neighboring pair of the source regions 112.

The use of the LOCOS technique in the foregoing process, however, can cause a stress problem and a bird's beak problem. These two problems can cause the isolation structures to be less effective when the flash EEPROM device is further downsized for high-density integration, particularly at the submicron level of integration below 0.25 $\mu$m (micrometers). One solution to these problems is to utilize the so-called shallow-trench isolation (STI) structure in lieu of the LOCOS structure.

However, the use of the STI technique in the process for fabricating the foregoing flash EEPROM device still has one drawback. This drawback will be depicted in the following with reference to FIG. 2, which is a schematic cross-sectional view of the flash EEPROM device of FIG. 1 cutting through the line III—III (the same view as FIG. 1C except when fabricated with the STI technique). As shown, if the STI technique is used to form the field oxide layers 102, it allows the ion-implantation process used to form the self-aligned source region (here designated by the reference numeral 118a for distinguishing purpose) to dope the impurity element only into the bottom part 160a of the void portion (here designated by the reference numeral 160) that is left behind by removing the field oxide isolation layers 102. Scarcely any of the impurity element is doped into the sidewalls 160b of the void portion 160. As a consequence, the resultant self-aligned source region 118a is not connected to the neighboring pair of the source regions 112. For this reason, the use of STI technique in the process for fabricating a flash EEPROM device is unfeasible.

SUMMARY OF THE INVENTION

It is therefore an objective of the present invention to provide a method of fabricating a flash EEPROM device, in which the STI technique can be used to form the field oxide isolation layers to make the EEPROM device suitable for fabrication at the submicron level of integration.

In accordance with the foregoing and other objectives of the present invention, a new method of fabricating a flash EEPROM device is provided. By the method of the invention, the first step is to prepare a semiconductor substrate, such as a silicon substrate. Next, a plurality of field oxide isolation layers are formed through STI process at selected locations over the substrate to define at least one active region in the substrate. After this, at least one gate structure is formed within the active region, which includes a tunnel oxide layer, a first conductive layer serving as a floating gate over the tunnel oxide layer, a dielectric layer over the first conductive layer, a second conductive layer serving as a control gate over the dielectric layer, and a topping layer over the second conductive layer. Subsequently, an ion-implantation process is performed to dope an impurity element into selected regions in the substrate so as to form at least one source region and at least one drain region beside the gate structure. A sidewall spacer is then formed on the sidewall of the gate structure. Next, a metallization layer is formed over the entire substrate, and then an insulating layer is formed over the metallization layer. The insulating layer is then selectively removed in such a manner that the remaining part thereof covers the source region and the field oxide isolation layers neighboring the source region. Finally, all the part of the metallization layer that is uncovered by the remaining part of the insulating layer is entirely removed.

In a preferred embodiment, the metallization layer can be a refractory metal such as titanium. In this case, the method of the invention can further includes a thermal annealing process to form self-aligned silicide at the junctions between the metallization layer and the substrate. This thermal annealing process can be performed either after the forming of the metallization layer and prior to the forming of the insulating layer, or after the forming of the insulating layer and prior to the selective removal of the insulating layer; or after the selective removal of the insulating layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method according to the invention for fabricating a flash EEPROM device is disclosed in the following with reference to FIGS. 3, 4, 5, 6, and 7; FIGS. 3A, 5A, 6A, and 7A; FIGS. 3B, 5B, 6B, and 7B; and FIGS. 3C, 5C, 6C, and 7C. In these drawings, FIGS. 3, 4, 5, 6, and 7 show the schematic top views of part of the fabricated wafer of the flash EEPROM device at various stages of the fabrication process. Those drawings with the same figure number but appended with the letters A, B, C respectively show the cross-sectional views of the fabricated wafer at the various stages shown in the corresponding figures cutting through the lines IV—IV, V—V, and VI—VI.

Figure 1:
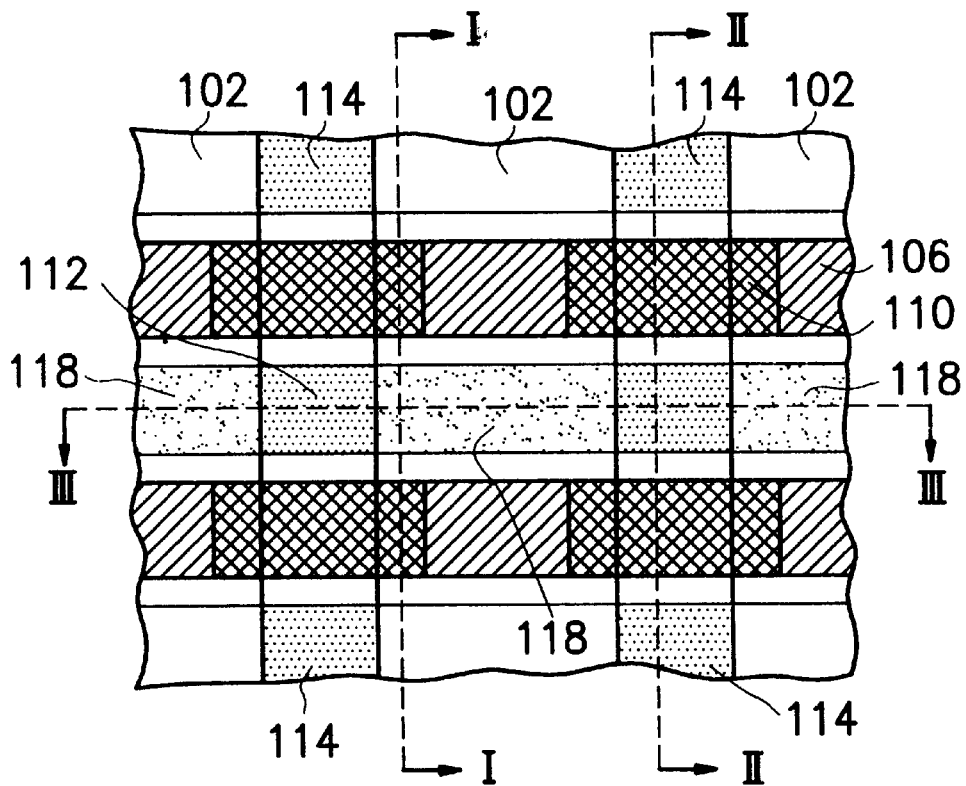
FIG. 1 is a schematic top view of a conventional flash EEPROM device.
Figure 1A:
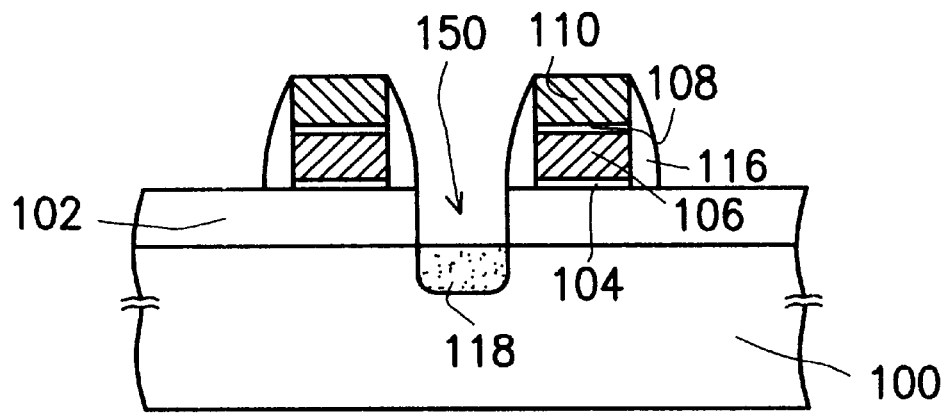
FIG. 1A is a schematic cross-sectional view of the conventional flash EEPROM device of FIG. 1 cutting through the line I—I.
Figure 1B:
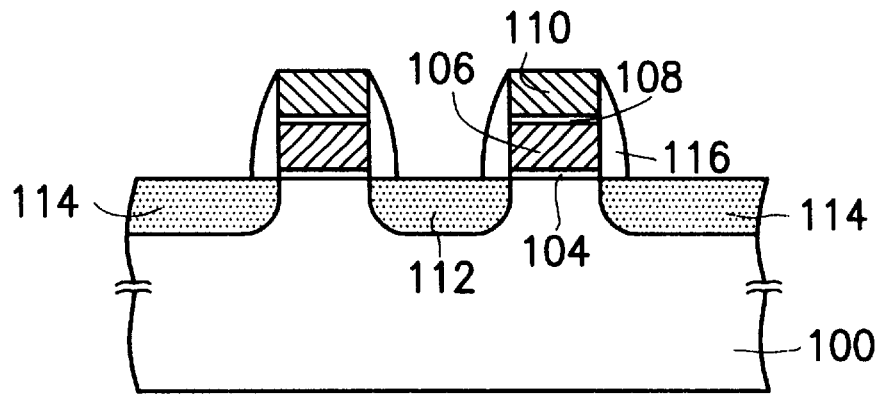
FIG. 1B is a schematic cross-sectional view of the conventional flash EEPROM device of FIG. 1 cutting through the line II—II.
Figure 1C:
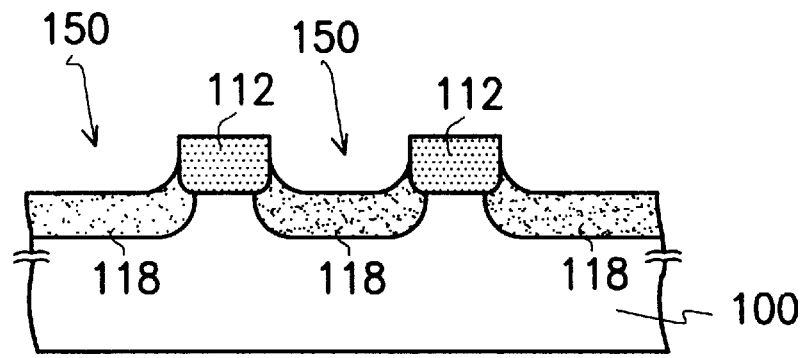
FIG. 1C is a schematic cross-sectional view of the conventional flash EEPROM device of FIG. 1 cutting through the line III—III.
Figure 2:
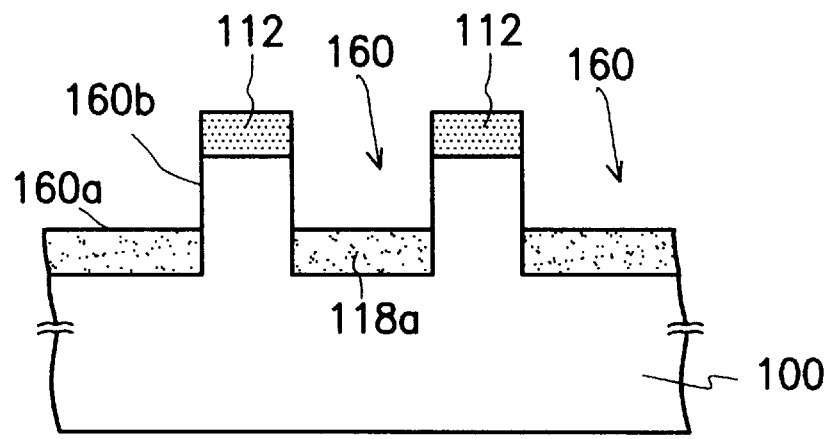
FIG. 2 shows the same of FIG. 1C except for a different case when the STI technique is used in the fabrication of the flash EEPROM device to form field oxide isolation layers.
Figure 3:
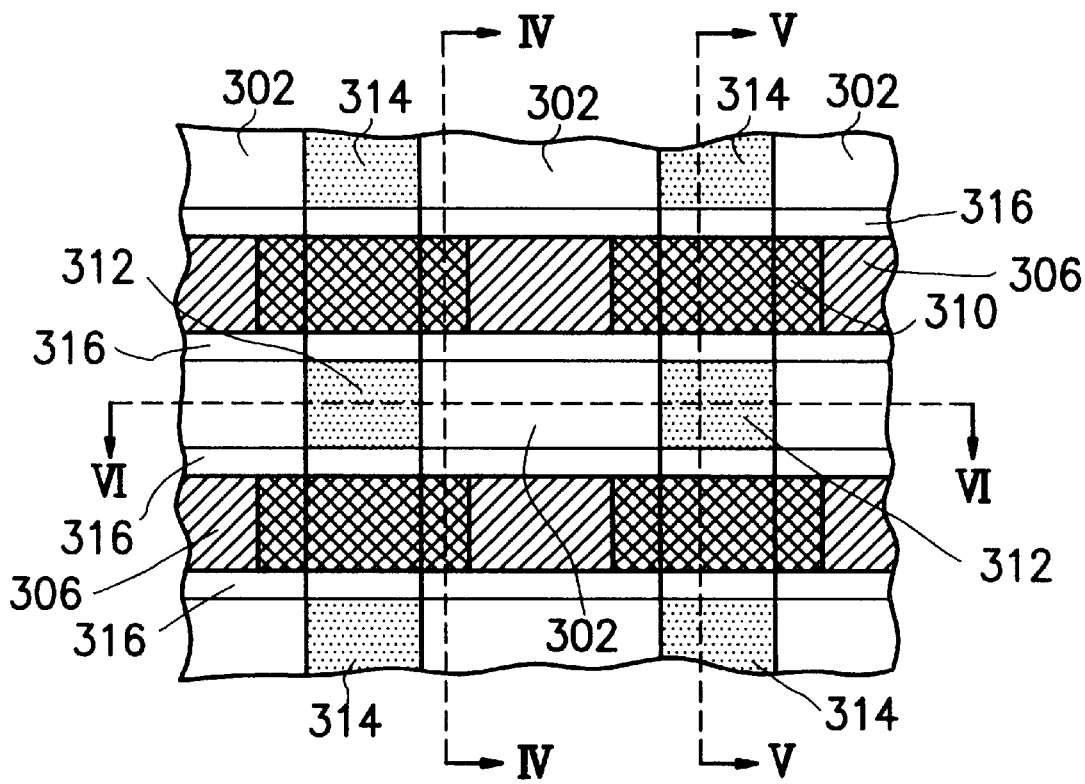
FIGS. 3, 4, 5, 6, and 7 are schematic diagrams of top views used to depict the steps involved in the method of the invention for fabricating a flash EEPROM device.
Figure 3A:
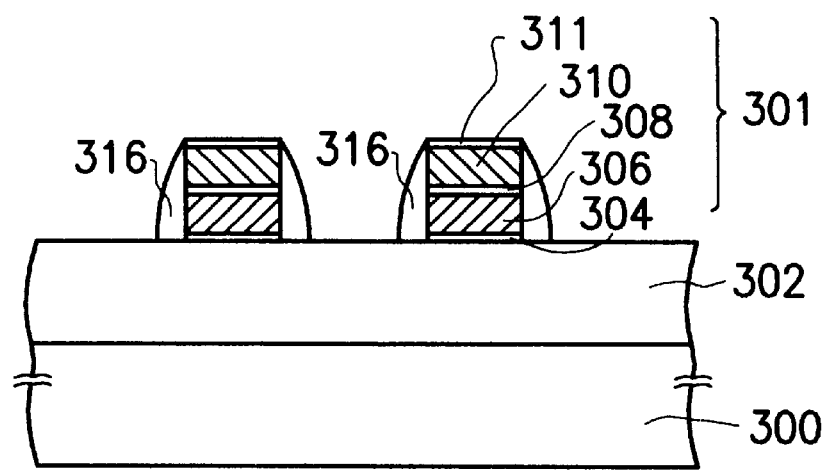
FIGS. 3A, 5A, 6A, and 7A are respectively the cross-sectional views of the fabricated wafers of FIGS. 3, 5, 6, and 7 cutting through the line IV—IV.
Figure 3B:
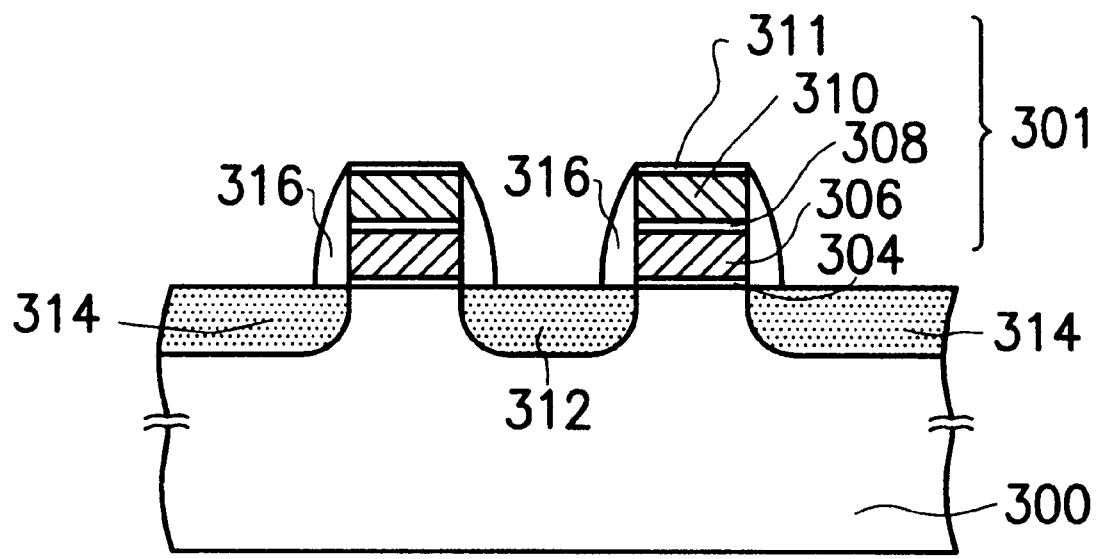
FIGS. 3B, 5B, 6B, and 7B are respectively the cross-sectional views of the fabricated wafers of FIGS. 3, 5, 6, and 7 cutting through the line V—V.
Figure 3C:
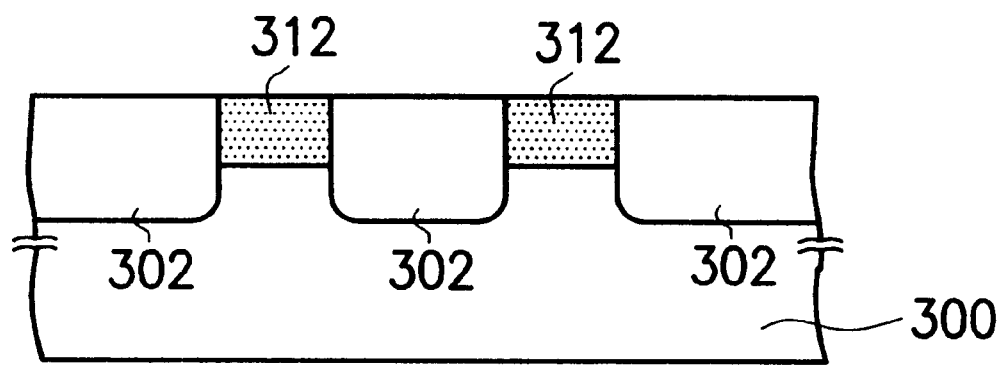
FIGS. 3C, 5C, 6C, and 7C are respectively the cross-sectional views of the fabricated wafers of FIGS. 3, 5, 6, and 7 cutting through the line VI—VI.

Referring first to FIG. 3 together with FIGS. 3A, 3B, and 3C, the flash EEPROM device is constructed on a semiconductor substrate 300, such as a P-type silicon substrate. A plurality of field oxide isolation layers 302 are then formed at selected locations over the substrate 300 through, for example, the STI technique. The STI process includes a first step of forming a plurality of trenches at the selected locations, and a second step of depositing oxide into these trenches through a CVD (chemical-vapor deposition) process. After the field oxide isolation layers 302 are formed, the next step is to form a plurality of tunnel oxide layers 304 at selected locations over the field oxide isolation layers 302, preferably to a thickness of 60–120 Å (angstrom). In general, the tunnel oxide layers 304 should be thin enough as to allow hot electrons to penetrate through. Next, a plurality of first conductive layers 306 are formed respectively over the tunnel oxide layers 304, preferably to a thickness of 800–2,000 Å, each being used to serve as a floating gate for each MOS memory cell of the flash EEPROM device. The process for forming the tunnel oxide layers 304 and the first conductive layers 306 includes, for example, a first step of forming a thin oxide layer over the entire top surface of the wafer; a second step of forming a polysilicon layer through a CVD process over this thin oxide layer; a third step of performing an ion-implantation process so as to dope an impurity element, such as phosphorus, in ion form at an energy of from 20 KeV to 50 KeV (kiloelectronvolt) with a concentration of from $10^{14}$ to $10^{15}$ atoms/cm$^2$ into the polysilicon layer so as to increase the conductivity thereof; and a final step of performing a selective removal process on both the doped polysilicon layer and the underlying thin oxide layer, with the remaining portions thereof serving as the above-mentioned tunnel oxide layers 304 and first conductive layers 306.

In the subsequent step, a dielectric layer 308 is formed over each first conductive layer 306 from a dielectric material such as ONO (oxide/nitride/oxide), to a thickness of 1,000–2,000 Å. Next, a second conductive layer 310 is formed over the dielectric layer 308 to serve as a control late for the MOS memory cell. The second conductive layer 310 can be formed, for example, by first depositing a polysilicon layer over the dielectric layer 308 to a thickness of 1,000–2,000 Å, and then performing an ion-implantation process to dope an impurity element, such as phosphorus, in ion form at an energy of 20–50 KeV with a concentration of $10^{15}$–$10^{16}$ atoms/cm$^2$ into the polysilicon layer so as to increase the conductivity thereof. The doped polysilicon layer then serves as the second conductive layer 310. After this, a topping layer 311 is formed over the second conductive layer 310 from an insulating material, such as silicon oxide, to a thickness of 1,500–2,000 Å.

As shown in FIG. 3A, a plurality of stacked structures (designated by the reference numeral 301), each consisting of one tunnel oxide layer 304, one first conductive layer 306, one dielectric layer 308, one second conductive layer 310, and one topping layer 311, are formed over the wafer. Each of these stacked structures 301 serves as a gate structure for each MOS memory cell of the flash EEPROM device. In the subsequent step, with the topping layers 311 serving as a mask, an ion-implantation process is performed on the unmasked areas of the substrate 300. In the case of the substrate 300 being P-type, the dopant is arsenic, which is implanted in ion form, preferably at an energy of 30–100 KeV with a concentration of $10^{15}$–$10^{16}$ atoms/cm$^2$, into the unmasked areas of the substrate 300, whereby a source region 312 and a drain region 314 are formed respectively on both sides of each gate structure 301. After this, a sidewall spacer 316 is formed on the sidewall of each gate structure 301 by, for example, first forming a dielectric layer over the entire top surface of the wafer, and then performing an etch-back process on the dielectric layer, with the remaining part thereof serving as the above-mentioned sidewall spacer 316.

Figure 4:
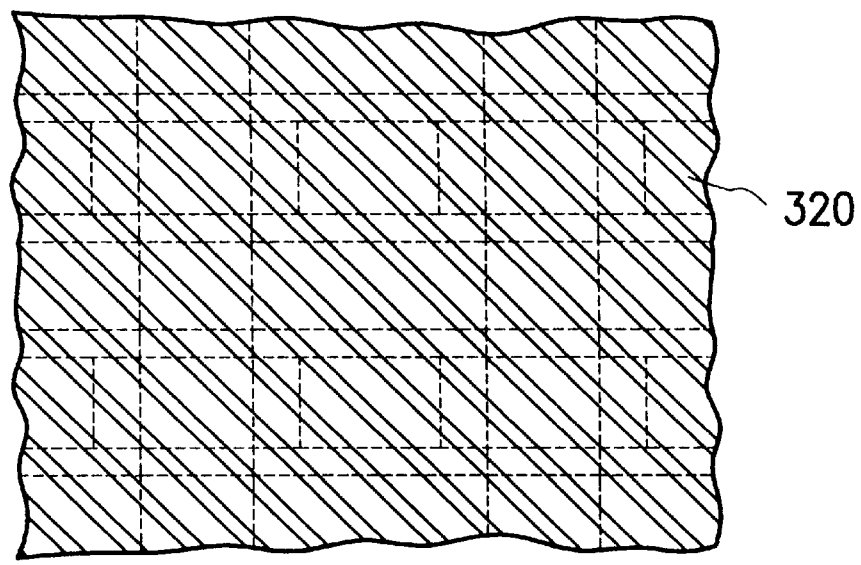

Referring further to FIG. 4, in the subsequent step, a metallization layer 320 is formed from a refractory metal, such as titanium, tungsten, cobalt, nickel, platinum, and palladium, and most preferably from titanium, over the entire top surface of the wafer. In this embodiment, for example, the metallization layer 320 is formed from titanium through a magnetically-controlled DC (direct current) sputtering process to a thickness of 200–1,000 Å.

Figure 5:
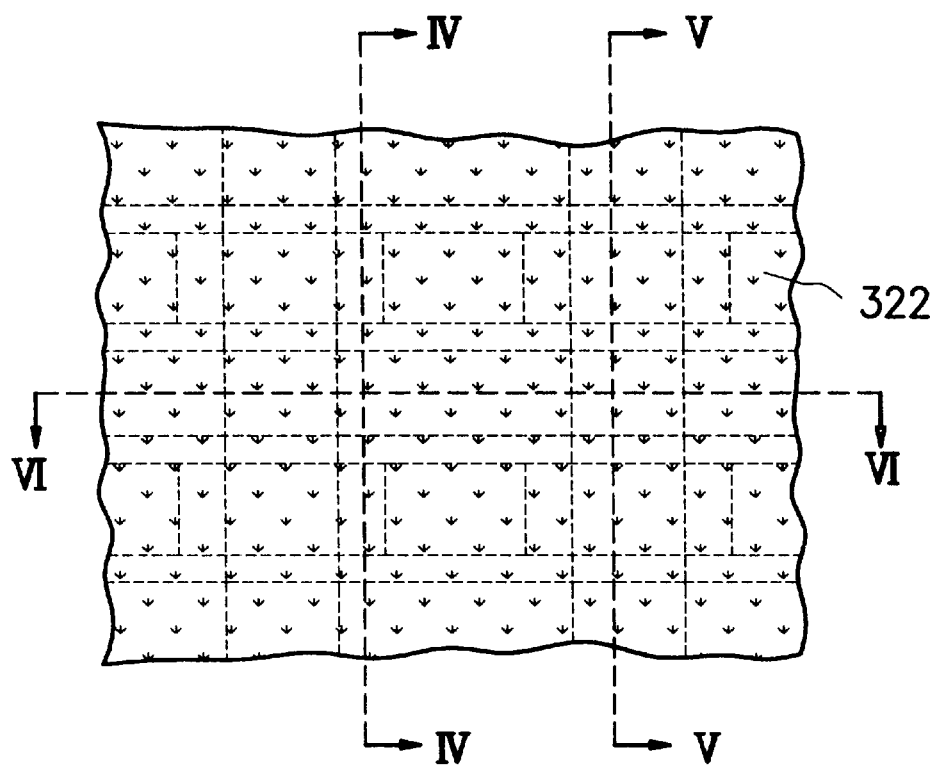
Figure 5A:
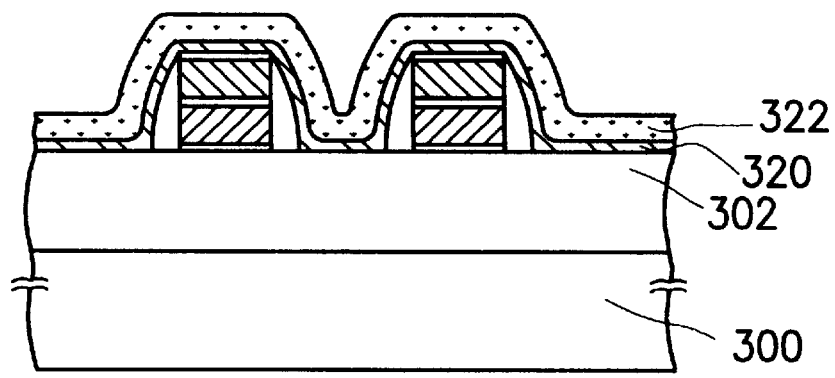
Figure 5B:
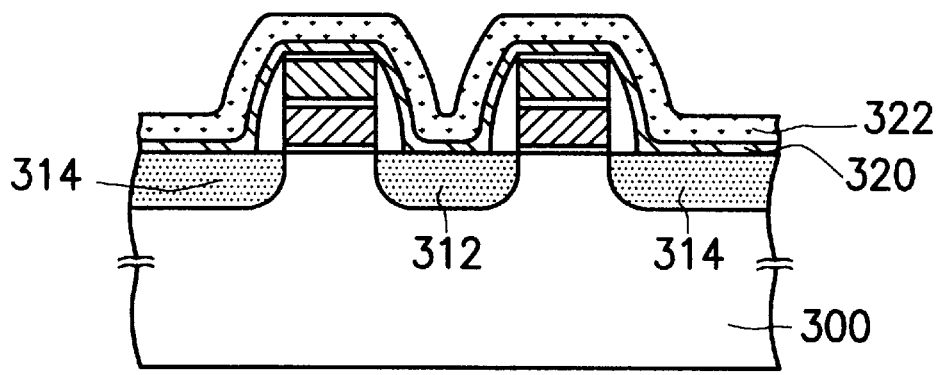
Figure 5C:
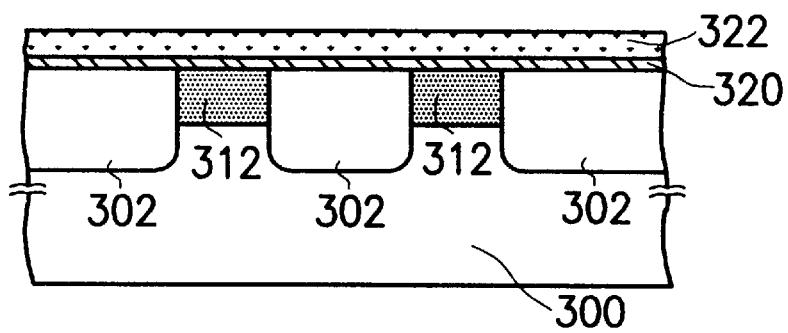

Referring next to FIG. 5 together with FIGS. 5A, 5B, and 5C, in the subsequent step, an insulating layer 322 is formed from a dielectric material, such as silicon oxide or $Si_xO_yN_z$, through a CVD process over the metallization layer 320.

Figure 6:
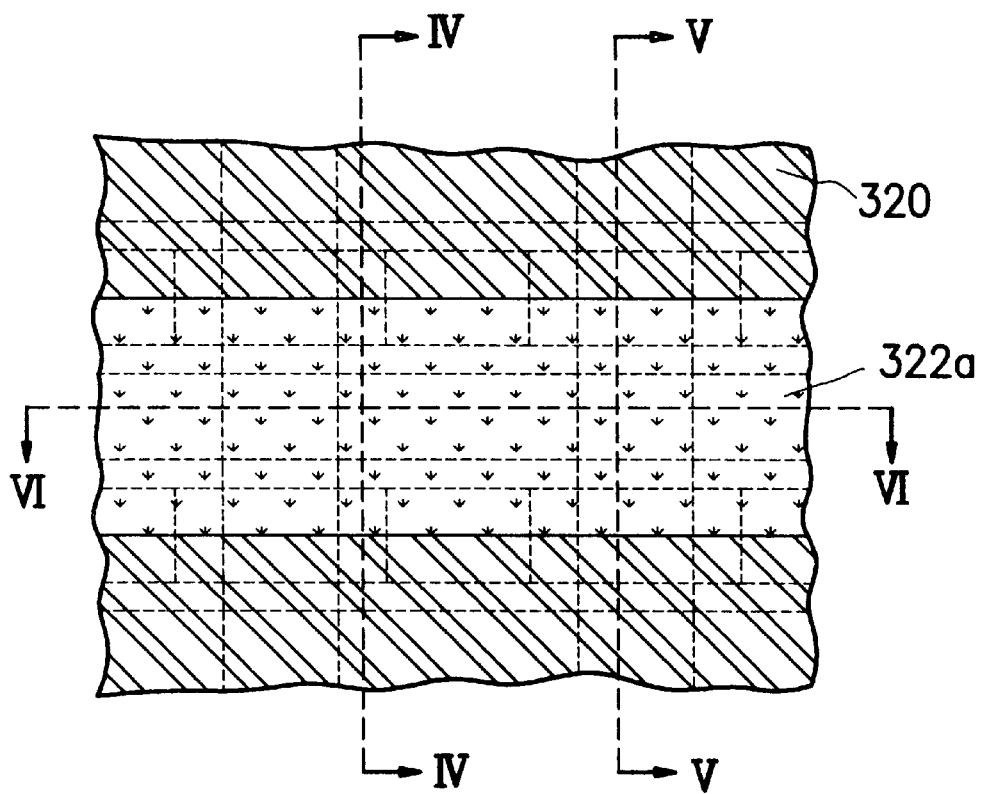
Figure 6A:
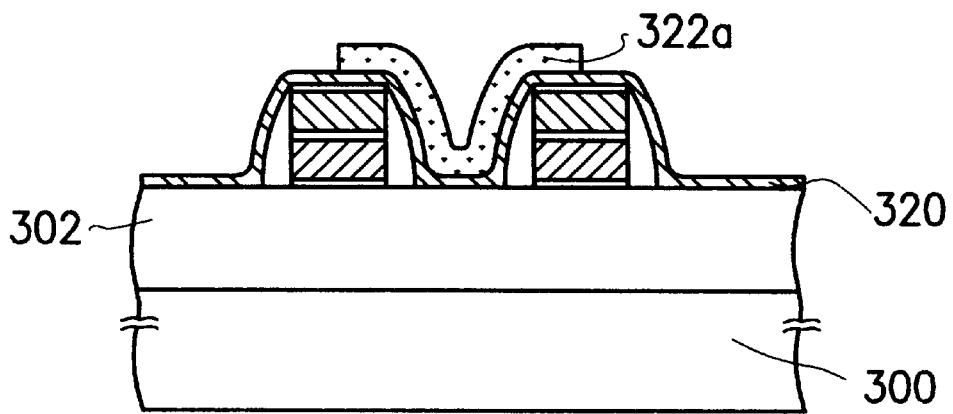
Figure 6B:
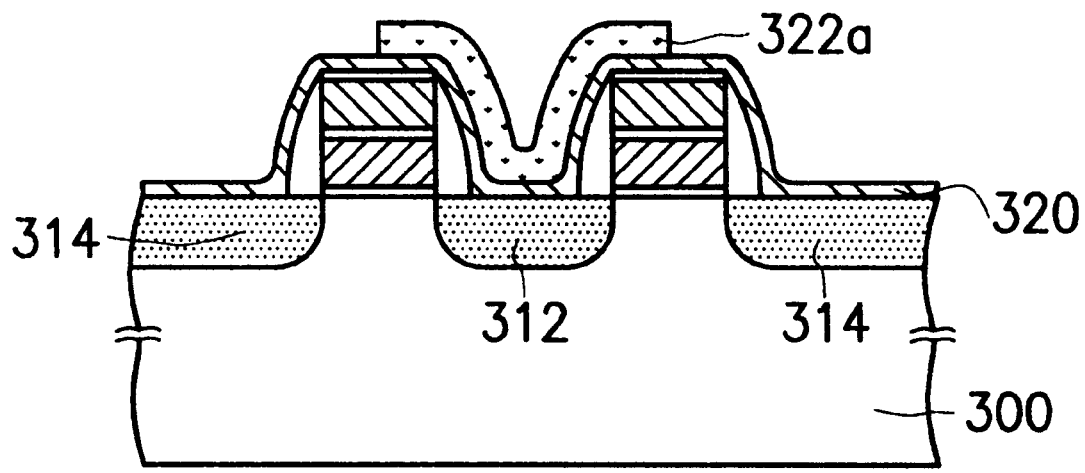
Figure 6C:
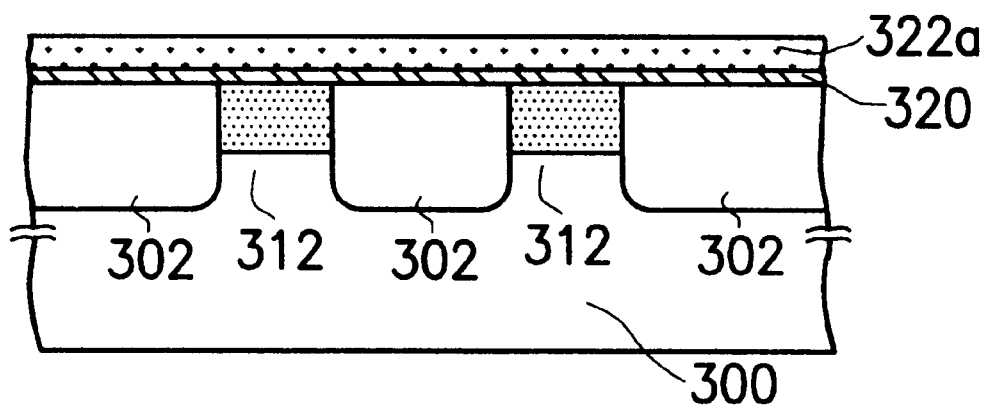

Referring further to FIG. 6 together with FIGS. 6A, 6B, and 6C, in the subsequent step, a selective removal process is performed on the insulating layer 322 in such a manner that the remaining portions of the insulating layer 322 (which are designated instead by the reference numeral 322a for distinguishing purpose) are left over each source region 312 between neighboring pair of gate structures 301 and cover half of each of the gate structures 301, with part of the metallization layer 320 being exposed. This selective removal process can be performed by, for example, first depositing a photoresist layer over the entire top surface of the wafer; then performing a photolithographic process to remove selected portions of the photoresist layer, with the remaining portions covering those areas where the insulating layer is to be left; then performing an anisotropic etching process to remove the unmasked portions of the insulating layer; and finally removing the entire photoresist layer.

Figure 7:
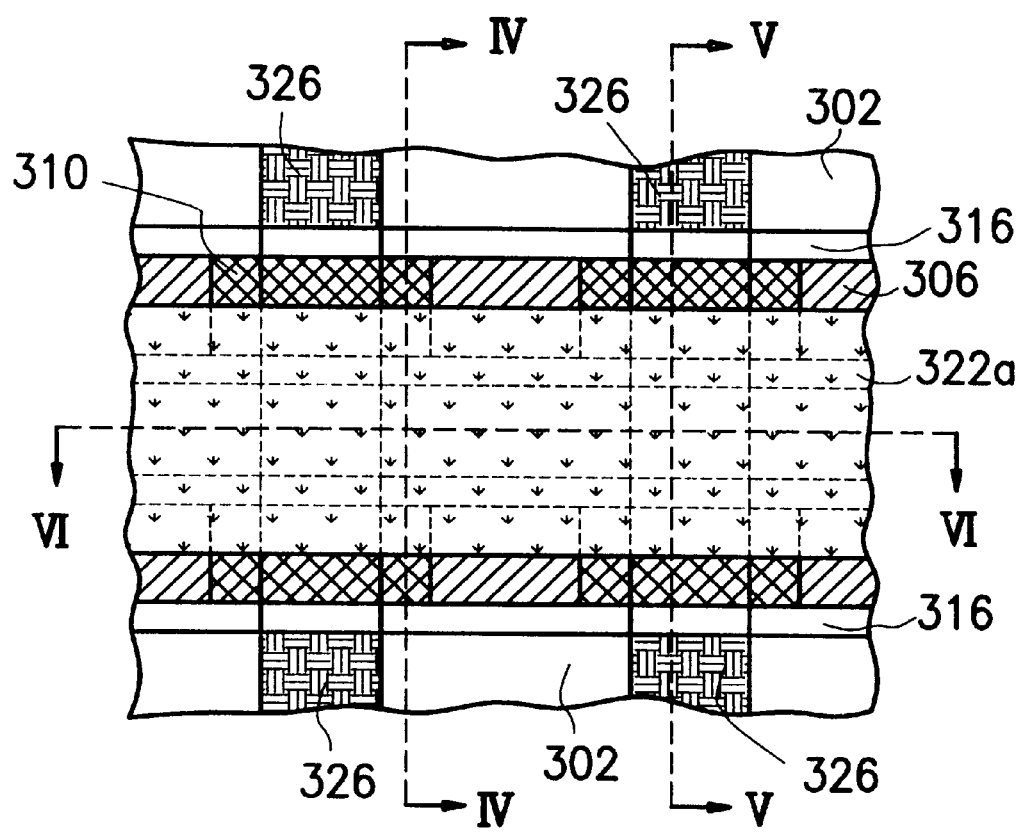
Figure 7A:
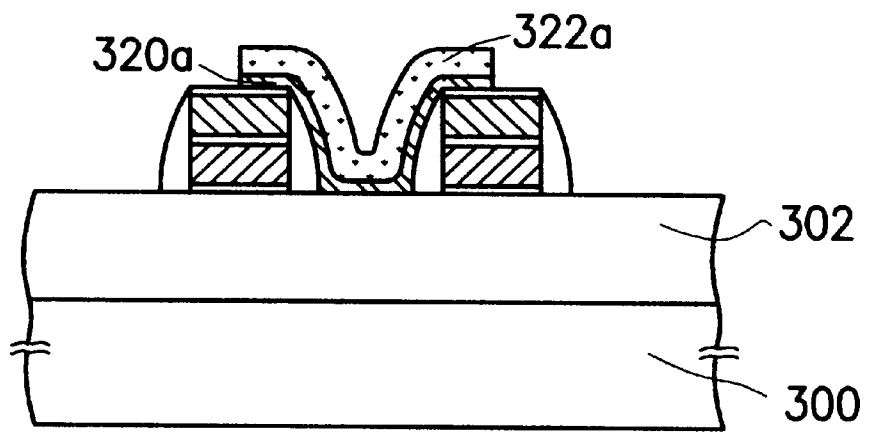
Figure 7B:
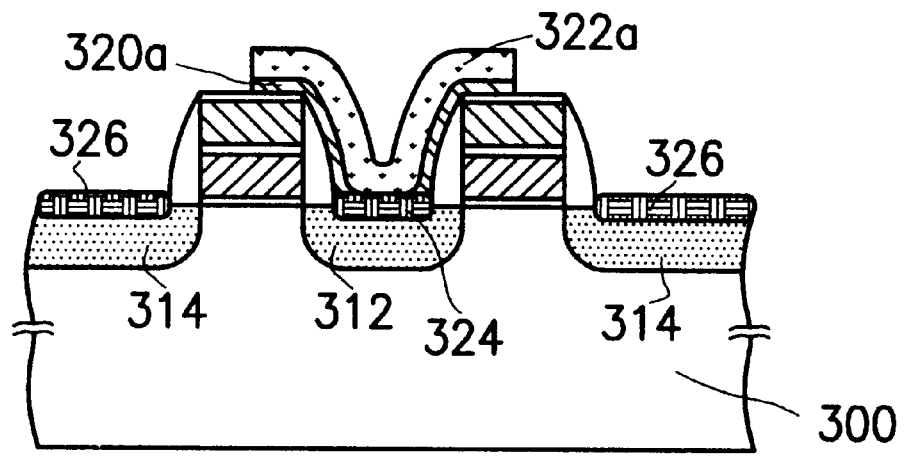
Figure 7C:
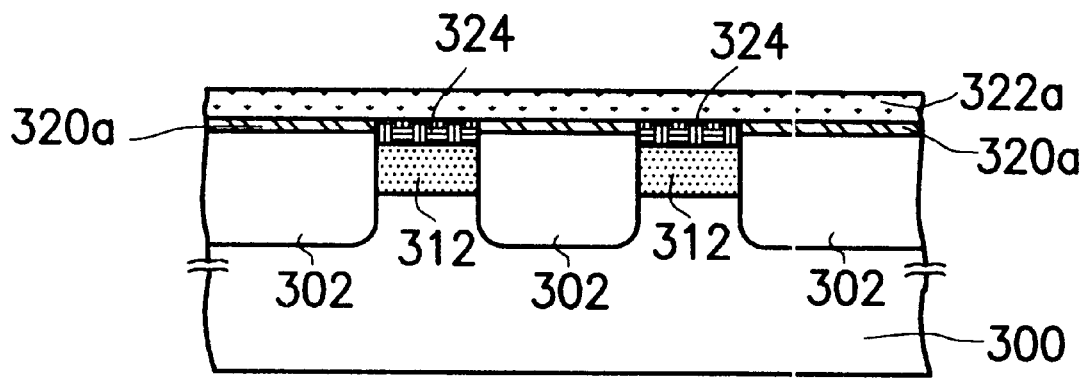

Referring next to FIG. 7 together with FIGS. 7A, 7B, and 7C, in the subsequent step, an etching process is performed on the wafer, so as to remove those portions of the metallization layer 320 that are unmasked by the insulating layer 322a (the remaining portions of the metallization layer 320 are here designated by the reference numeral 320a for distinguishing purpose). The remaining metallization layer 320a covers over the source region 312 and all the field oxide isolation layers 302 beside the source region 312 to serve as a metal interconnecting line to the source region 312. Preferably, a thermal annealing process is performed prior to the removal of the unmasked portions of the metallization layer 320 so as to cause reaction between the metal and silicon atoms at the junction between the metallization layer 320 and the substrate 300, thereby forming self-aligned silicide layers 324, 326 in the source region 312 and the drain region 314. The forming of the silicide layer 324 can help increase the conductivity of the electrical contact between the metallization layer 320a and the source region 312, and the forming of the silicide layer 326 can help reduce the electrical resistance of the drain region 314. In the case of the metallization layer 320 being formed from titanium, for example, the thermal annealing process can be an RTP (rapid thermal process) which rapidly raises the ambient temperature surrounding the wafer up to about 700° C., then maintains the temperature at this level for a continuous period of about 30 seconds, whereby the titanium atoms at the junction between the metallization layer 320 and the source region 312 and the drain region 314 are converted into the so-called C-49 stable phase titanium silicide layer with large granularity and high electrical resistance. Next, a wet etching process is performed on the wafer by submerging the entire wafer in an aqueous solution of $H_2O_2$ and $NH_4OH$, whereby the unreacted part of the titanium in the metallization layer 320 is removed. Subsequently, a second RTP is performed on the wafer by first rapidly raising the temperature up to about 750° C., and then maintaining the temperature at this level for a continuous period of about 10 minutes. As a result of this process, the C-49 stable phase titanium silicide layers are converted into C-54 orthogonal titanium silicide layers, which serve as the above-mentioned silicide layers 324, 326.

The foregoing thermal annealing process can be performed at one of the following three various stages: either after the forming of the metallization layer 320 and prior to the forming of the insulating layer 322 (i.e., after the wafer of FIG. 4 is completed), after the forming of the insulating layer 322 and prior to the selective removal of the insulating layer 322 (i.e., after the wafer of FIG. 5 is completed), or after the selective removal of the insulating layer 322. In general, the thermal annealing process is performed for the purpose of converting the metallization layer 320 over the source region 312 and the drain region 314 into silicide layers 324, 326. After this, the wet etching process for removing the unreacted part of the metallization layer 320 can be performed after the selective removal of the insulating layer 322 is completed.

In conclusion, the method of the invention for fabricating a flash EEPROM device has the following advantages over the prior art.

(1) First, the method of the invention allows the use of the STI technique to form field oxide isolation layers in the substrate, and is thus suitable for use in fabrication of the flash EEPROM device at the submicron level of integration.

(2) Second, the method of the invention allows the metal interconnecting lines to the source regions to be formed through the metallization layers formed over the source regions and the neighboring field oxide isolation layers. This feature allows the elimination of the drawback of the unfeasibility of performing an ion-implantation process on the polysilicon-based metal interconnecting lines to increase the conductivity thereof after the insulating layer is removed that would otherwise occur when using the STI technique in the prior art.

(3) Third, the method of the invention allows the metal interconnecting lines to the source regions to be more easily formed than in the prior art; and moreover, the thermal annealing process also allows the drain regions to be reduced in electrical resistance due to the forming of silicide layers.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a flash EEPROM device, the method comprising the steps of:

preparing a semiconductor substrate;

forming a plurality of field oxide isolation layers at selected locations over the substrate to define at least one active region in the substrate;

forming at least one gate structure within the active region, including a tunnel oxide layer, a first conductive layer over the tunnel oxide layer, a dielectric layer over the first conductive layer, a second conductive layer over the dielectric layer, and a topping layer over the second conductive layer;

doping an impurity element into selected regions of the substrate so as to form at least one source region and at least one drain region beside the gate structure;

forming a sidewall spacer on the sidewall of the gate structure;

forming a metallization layer over the entire substrate;

forming an insulating layer over the metallization layer;

performing a selective removal process on the insulating layer in such a manner that the remaining part thereof covers the source region and the field oxide isolation layers neighboring the source region; and removing all the part of the metallization layer that is uncovered by the remaining part of the insulating layer.

2. The method of claim 1, wherein the field oxide isolation layers are formed by STI technique.

3. The method of claim 2, wherein the substrate is silicon substrate.

4. The method of claim 1, wherein the metallization layer is formed from a refractory metal.

5. The method of claim 3, wherein the metallization layer is formed from a refractory metal.

6. The method of claim 5, further comprising, after the forming of the metallization layer and prior to the forming of the insulating layer, the step of performing a thermal annealing process to form self-aligned silicide at the junctions between the metallization layer and the substrate.

7. The method of claim 5, further comprising, after the forming of the insulating layer and prior to the selective removal of the insulating layer, the step of performing a thermal annealing process to form self-aligned silicide at the junctions between the metallization layer and the substrate.

8. The method of claim 5, further comprising, after the selective removal of the insulating layer, the step of performing a thermal annealing process to form self-aligned silicide at the junctions between the metallization layer and the substrate.

9. The method of claim 5, wherein the refractory metal is titanium.

10. The method of claim 9, further comprising, after the forming of the metallization layer and prior to the forming of the insulating layer, the step of performing a thermal annealing process to form self-aligned silicide at the junctions between the metallization layer and the substrate.

11. The method of claim 9, further comprising, after the forming of the insulating layer and prior to the selective removal of the insulating layer, the step of performing a thermal annealing process to form self-aligned silicide at the junctions between the metallization layer and the substrate.

12. The method of claim 9, further comprising, after the selective removal of the insulating layer, the step of performing a thermal annealing process to form self-aligned silicide at the junctions between the metallization layer and the substrate.

13. The method of claim 9, wherein the step of removing all the part of the metallization layer that is uncovered by the remaining part of the insulating layer is carried out by performing a wet etching process using an aqueous solution of $H_2O_2$ and $NH_4OH$ as etchant.

14. A method for fabricating a flash EEPROM device, the method comprising the steps of:

preparing a semiconductor substrate;

performing an STI process to form a plurality of field oxide isolation layers at selected locations over the substrate to define at least one active region in the substrate;

forming at least one gate structure within the active region, including a tunnel oxide layer, a first conductive layer over the tunnel oxide layer, a dielectric layer over the first conductive layer, a second conductive layer over the dielectric layer, and a topping layer over the second conductive layer;

doping an impurity element into selected regions of the substrate so as to form at least one source region and at least one drain region beside the gate structure;

forming a sidewall spacer on the sidewall of the gate structure;

forming a metallization layer over the entire substrate;

forming an insulating layer over the metallization layer;

performing a selective removal process on the insulating layer in such a manner that the remaining part thereof covers the source region and the field oxide isolation layers neighboring the source region; and removing all the part of the metallization layer that is uncovered by the remaining part of the insulating layer.

15. The method of claim 14, wherein the substrate is a silicon substrate.

16. The method of claim 15, wherein the metallization layer is formed from a refractory metal.

17. The method of claim 16, further comprising, after the forming of the metallization layer and prior to the forming of the insulating layer, the step of performing a thermal annealing process to form self-aligned silicide at the junctions between the metallization layer and the substrate.

18. The method of claim 16, further comprising, after the formation of the insulating layer and prior to the selective removal of the insulating layer, the step of performing a thermal annealing process to form self-aligned silicide at the junctions between the metallization layer and the substrate.

19. The method of claim 16, further comprising, after the selective removal of the insulating layer, the step of performing a thermal annealing process to form self-aligned silicide at the junctions between the metallization layer and the substrate.

20. A method for fabricating a flash EEPROM device, the method comprising the steps of:

preparing a semiconductor substrate;

performing an STI process to form a plurality of field oxide isolation layers at selected locations over the substrate to define at least one active region in the substrate;

forming at least one gate structure within the active region, including a tunnel oxide layer, a first conductive layer over the tunnel oxide layer, a dielectric layer over the first conductive layer, a second conductive layer over the dielectric layer, and a topping layer over the second conductive layer;

doping an impurity element into selected regions of the substrate so as to form at least one source region and at least one drain region beside the gate structure;

forming a sidewall spacer on the sidewall of the gate structure;

forming a metallization layer over the entire substrate;

performing a thermal annealing process to form self-aligned silicide at the junctions between the metallization layer and the substrate;

forming an insulating layer over the metallization layer;

performing a selective removal process on the insulating layer in such a manner that the remaining part thereof covers the source region and the field oxide isolation layers neighboring the source region; and removing all the unreacted part of the metallization layer that is uncovered by the remaining part of the insulating layer.

21. A method for fabricating a flash EEPROM device, the method comprising the steps of:

preparing a semiconductor substrate;

performing an STI process to form a plurality of field oxide isolation layers at selected locations over the substrate to define at least one active region in the substrate;

forming at least one gate structure within the active region, including a tunnel oxide layer, a first conductive layer over the tunnel oxide layer, a dielectric layer over the first conductive layer, a second conductive layer over the dielectric layer, and a topping layer over the second conductive layer;

doping an impurity element into selected regions of the substrate so as to form at least one source region and at least one drain region beside the gate structure;

forming a sidewall spacer on the sidewall of the gate structure;

forming a metallization layer over the entire substrate;

forming an insulating layer over the metallization layer;

performing a thermal annealing process to form self-aligned silicide at the junctions between the metallization layer and the substrate;

performing a selective removal process on the insulating layer in such a manner that the remaining part thereof covers the source region and the field oxide isolation layers neighboring the source region; and removing all the unreacted part of the metallization layer that is uncovered by the remaining part of the insulating layer.

22. A method for fabricating a flash EEPROM device, the method comprising the steps of:

preparing a semiconductor substrate;

performing an STI process to form a plurality of field oxide isolation layers at selected locations over the substrate to define at least one active region in the substrate;

forming at least one gate structure within the active region, including a tunnel oxide layer, a first conductive layer over the tunnel oxide layer, a dielectric layer over the first conductive layer, a second conductive layer over the dielectric layer, and a topping layer over the second conductive layer;

doping an impurity element into selected regions of the substrate so as to form at least one source region and at least one drain region beside the gate structure;

forming a sidewall spacer on the sidewall of the gate structure;

forming a metallization layer over the entire substrate;

forming an insulating layer over the metallization layer;

performing a selective removal process on the insulating layer in such a manner that the remaining part thereof covers the source region and the field oxide isolation layers neighboring the source region;

performing a thermal annealing process to form self-aligned silicide at the junctions between the metallization layer and the substrate; and removing all the part of the metallization layer that is uncovered by the remaining part of the insulating layer.

* * * * *